United States Patent
Cheng et al.

(10) Patent No.: US 10,861,793 B2
(45) Date of Patent: Dec. 8, 2020

(54) GUARD RING FREQUENCY TUNING

(71) Applicant: QUALCOMM Incorporated, San Diego, CA (US)

(72) Inventors: Haitao Cheng, San Diego, CA (US); Ye Lu, San Diego, CA (US); Chao Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/051,525

(22) Filed: Aug. 1, 2018

(65) Prior Publication Data

US 2020/0043863 A1 Feb. 6, 2020

(51) Int. Cl.
*H01L 23/552* (2006.01)
*H01L 23/66* (2006.01)
*H01L 23/58* (2006.01)
*H01L 23/522* (2006.01)

(52) U.S. Cl.
CPC ............ *H01L 23/552* (2013.01); *H01L 23/66* (2013.01); *H01L 23/5227* (2013.01); *H01L 23/585* (2013.01); *H01L 2223/6688* (2013.01)

(58) Field of Classification Search
CPC ............ H01L 23/552; H01L 23/66; H01L 2223/6688; H01L 23/585; H01L 23/5227
See application file for complete search history.

(56) References Cited

U.S. PATENT DOCUMENTS

| | | | |
|---|---|---|---|
| 2005/0186917 A1* | 8/2005 | Rofougaran | H03F 3/245 455/73 |
| 2009/0152674 A1* | 6/2009 | Uchida | H01L 23/5227 257/531 |
| 2009/0201100 A1* | 8/2009 | Kossel | H03H 7/185 333/138 |
| 2010/0259319 A1* | 10/2010 | Chan | H03F 1/565 327/563 |
| 2012/0223796 A1 | 9/2012 | Huang et al. | |
| 2013/0141177 A1* | 6/2013 | Narathong | H01F 21/12 331/117 FE |
| 2015/0116037 A1* | 4/2015 | Kanemaru | H03F 1/565 330/282 |
| 2015/0130552 A1 | 5/2015 | Bhagat et al. | |
| 2016/0248394 A1* | 8/2016 | Chen | H03H 1/00 |
| 2017/0025367 A1 | 1/2017 | Yang et al. | |
| 2019/0229699 A1* | 7/2019 | Joshi | H01L 28/40 |

OTHER PUBLICATIONS

International Search Report and Written Opinion—PCT/US2019/040042—ISA/EPO—dated Sep. 25, 2019.

* cited by examiner

*Primary Examiner* — Patricia D Reddington
(74) *Attorney, Agent, or Firm* — Qualcomm Incorporated/Seyfarth Shaw LLP

(57) ABSTRACT

Aspects generally relate to tuning a guard ring in an integrated circuit. A guard ring with a gap surrounds a circuit. The level of isolation provided by the guard ring at a particular frequency can be adjusted by coupling a tuning circuit cross the gap of the guard ring. If the circuit in the guard ring is an inductive circuit the level of inductance at a particular frequency can be adjusted by selecting the appropriate tuning circuit across the gap of the guard ring.

21 Claims, 8 Drawing Sheets

GUARD RING FREQUENCY TUNING

BACKGROUND

I. Field of the Disclosure

Aspects of the disclosure relate generally to guard rings, and in particular to using circuit components to tune the guard ring for a desired response.

II. Background

An integrated circuit (IC) is an electronic device that has many circuits that include active and passive components. In a typical IC the components are manufactured in and on a semiconductor substrate material.

During operation, circuits in the IC can generate electrical noise that interfere with the operation of other circuits or components in the IC. For example, in a typical digital circuit there are many signals that are switching High and Low and the switching causes electrical noise that can interfere with the operation of other circuits or components. In addition, radio frequency (RF) IC have very high frequency signals that can radiate electrical noise that can interfere with the operation of other circuits or components. Also, noise can be coupled from one circuit to other circuits through power/ground connections.

A technique to provide increased isolation and reduce interference from one circuit to another circuit or component is the use of a guard ring to surround, or partially surround, a circuit or component to electrically isolate it. Guard rings help provide isolation, but their effectiveness may be reduced depending on the frequency.

There is a need for guard rings to provide increased isolation at desired frequencies.

SUMMARY OF THE DISCLOSURE

The following presents a simplified summary of one or more aspects to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

The described aspects generally relate to using to adjust a guard ring structure operation at a particular frequency.

In an embodiment, an integrated circuit includes a guard ring formed using several metal layers of the integrated circuit. The guard ring has a gap and surrounds a portion of a circuit. Coupled across the gap of the guard ring is a tuning circuit made up of tuning components. In one embodiment the tuning circuit is a transistor configured as a switch.

In other embodiments the tuning circuit can include, for example, a resistor, a capacitor, an inductor, an active device, and combinations of components. The resistor can be, for example, a poly resistor or a metal resistor. The capacitor can be, for example, a metal-oxide-metal (MOM) capacitor, a metal-insulator-metal (MIM) capacitor, or a metal-oxide-silicon (MOS) capacitor. The inductor can be, for example, a one-turn inductor or a multi-turn indictor. In another embodiment, the tuning circuit can be an inductor capacitor (LC) resonator. In yet another embodiment, the tuning circuit can be a transformer. Likewise, in other embodiment the tuning circuit can be various combinations of components.

In an embodiment, a guard ring may include more than one gap. Tuning circuits can be coupled across one or more, or all, of the gaps in the guard ring.

In yet another embodiment, a method of using a guard ring with a tuning circuit includes forming a guard ring around a circuit, the guard ring having a gap. Coupling tuning components across the gap in the guard ring.

Tuning components can be selected to vary the isolation provided by the guard ring at different frequencies. In this way the guard ring can be set to provide a level of isolation at one frequency and a different level of isolation at a different frequency.

In addition, if the guard ring surrounds an inductor or inductive circuit, tuning components can be selected to provide an inductance value of the inductive circuit at one frequency and a different value of inductance at a different frequency. This may be beneficial for circuits that operate at different frequencies.

Various aspect and features of the disclosure are described in further detail below.

BRIEF DESCRIPTION OF THE FIGURES

The accompanying drawings are presented to aid in the description and illustrations of embodiments and are not intended to be limitations thereof.

The drawings may not depict all components of a particular apparatus, structure, or method. Further, like reference numerals denote like features throughout the specification and figures.

DETAILED DESCRIPTION

Aspects disclosed in the following description and related drawings are directed to specific embodiments. Alternative embodiments may be devised without departing from the scope of the invention. Additionally, well-known elements may not be described in detail, or may be omitted, so as not to obscure relevant details. Embodiments disclosed may be suitably included in any electronic device.

Figure 1A:
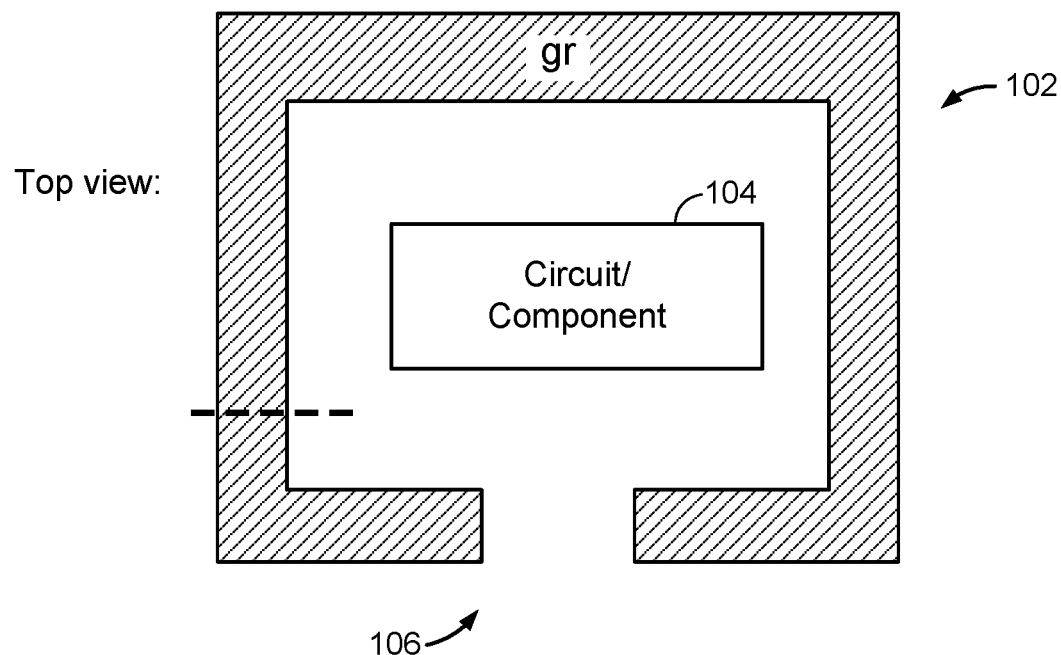
FIGS. 1A and 1B are diagrams illustrating a typical guard ring in an IC.

With reference now to the drawing, several exemplary aspects of the present disclosure are described. The word "exemplary" is used herein to mean "serving as an example, instance, or illustration." Any aspect described herein as "exemplary" is not necessarily to be construed as preferred or advantageous over other aspects. Furthermore, the terminology used herein is for the purpose of describing particular embodiments and is not intended to be limiting FIG. 1A is a diagram illustrating a top view of typical guard ring in an IC. As shown in FIG. 1A, the guard ring 102 is a conductive material that surrounds a circuit or component 104 to isolate the circuit or component 104 from electrical noise from other circuits or components in the IC. In the example of FIG. 1A the guard ring 102 does not completely surround the circuit or component 104, there being a gap 106 in the guard ring. In other examples the guard ring 102 can surround the circuit or component 104 and there would not be a gap 106.

Figure 1B:
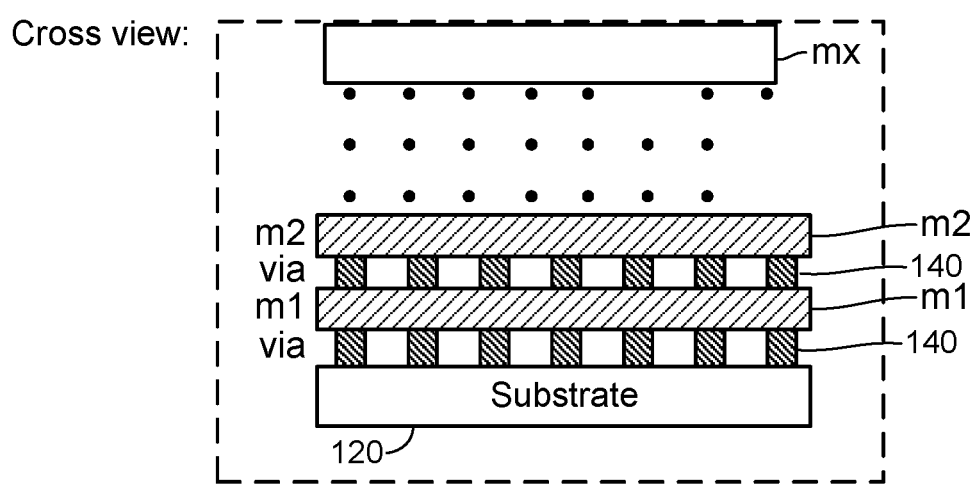

FIG. 1B is a cross section of the guard ring of FIG. 1A. FIG. 1B shows the IC includes a substrate 120, for example a silicon substrate, a plurality of metal layers M1, M2, . . . Mx. Between the substrate 120 and the first metal layer M1, and between adjacent metal layers, there are interlayer dielectric layers, not shown. Extending through the dielectric layer from the first metal layer M1 to the substrate, and between adjacent metal layers are a plurality of vias 140 coupling the metal layers. A guard ring 102 is formed using a desired plurality of metal layer M1, M2, . . . , Mx and vias 140.

Figure 2:
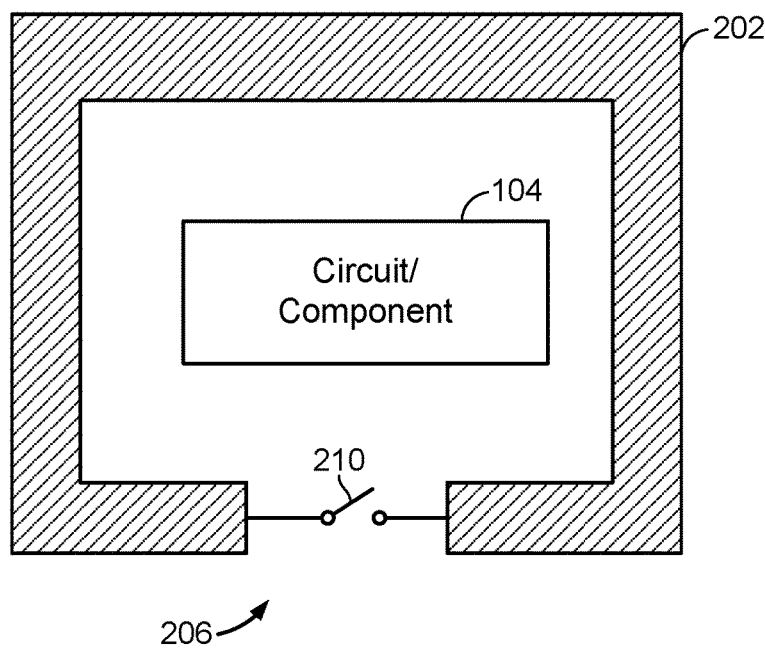
FIG. 2 is a diagram of a guard ring with frequency tuning components.

FIG. 2 is a diagram of a guard ring with frequency tuning components. FIG. 2 shows a guard ring 202 that surrounds a circuit or component 104 to isolate the circuit or component. The guard ring 202 does not completely surround the circuit or component 104, there being a gap 206 in the guard ring. A switch 210 is coupled across the gap 206. In one embodiment the switch 210 can be a transistor. When the switch 210 is Open the guard ring provides one level of isolation. When the switch 210 is Closed the guard ring provides a different level of isolation.

While FIG. 2 shows a guard ring with one gap, in other embodiments s guard ring can have more than one gap, for example, two or more gaps. Tuning components can be coupled across some, or all, of the gaps. FIG. 2 illustrates a single tuning component, switch 210, coupled across the gap. In other embodiments, as discussed further below, more than one tuning component can be coupled across the gap. As discussed further below, tuning components can be, for example, switches, transistors, resistors, capacitors, inductors, active circuits, varactors, an amplifier, and other active and passive devices.

Figure 3:
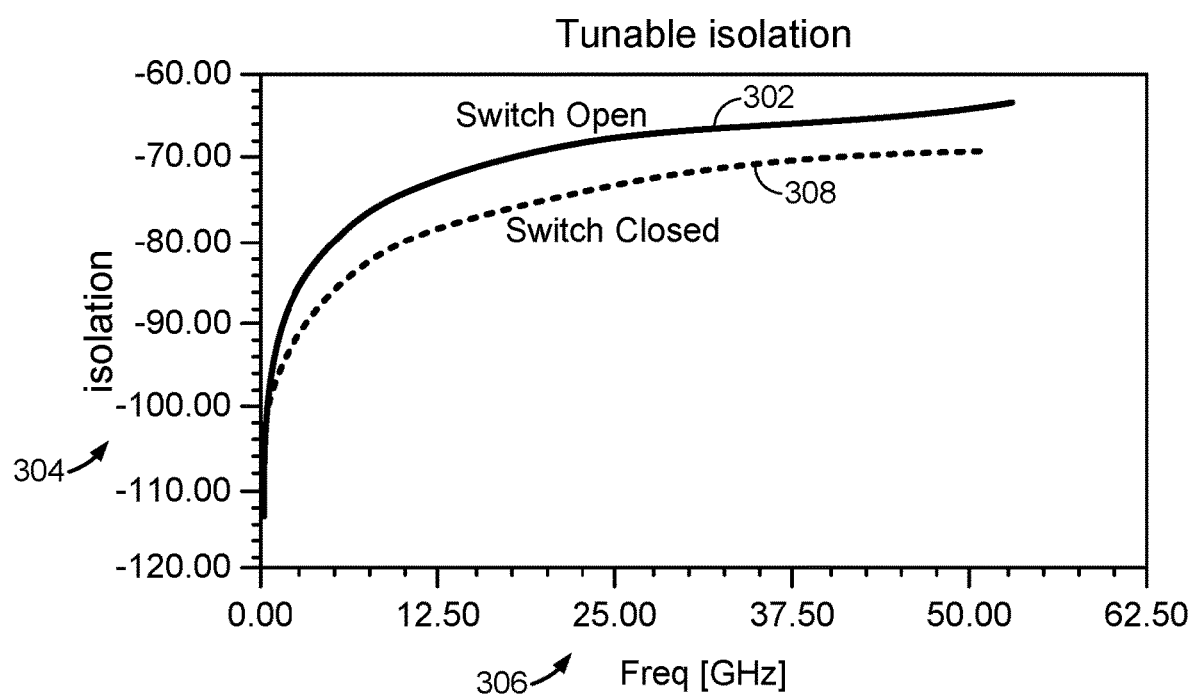
FIG. 3 is a diagram illustrating relative levels of isolation for a guard ring with a tuning circuit couple across a gap in the guard ring.

FIG. 3 is a diagram illustrating relative levels of isolation for the guard ring 202 of FIG. 2 when the switch 210 is Open and Closed. FIG. 3 shows a first curve 302 of isolation 304 versus frequency 306 for the guard ring 202 with the switch 206 Open. FIG. 3 also shows a second curve 308 of isolation 304 versus frequency 306 for the guard ring 202 with the switch 206 Closed.

As FIG. 3 shows, the isolation provided by the guard ring 202 at a particular frequency is different with the switch 210 Open versus Closed. For example, at a frequency of about 10 GHz, the isolation provided by the guard ring 202 with the switch 210 Closed (curve 308) is about −80 dB and the isolation with the switch Open (curve 302) is about −74 dB. At a frequency of about 20 GHz, the isolation provided by the guard ring 202 with the switch 210 Closed (curve 308) is about −75 dB and the isolation with the switch Open (curve 302) is about −70 dB. At a frequency of about 40 GHz, the isolation provided by the guard ring 202 with the switch 210 Closed (curve 308) is about −70 dB and the isolation with the switch Open (curve 302) is about −65 dB. As FIG. 3 illustrates, by Opening or Closing the switch 210 the isolation of the guard ring 202 can vary at different frequency to provide a desired isolation value.

Figure 4:
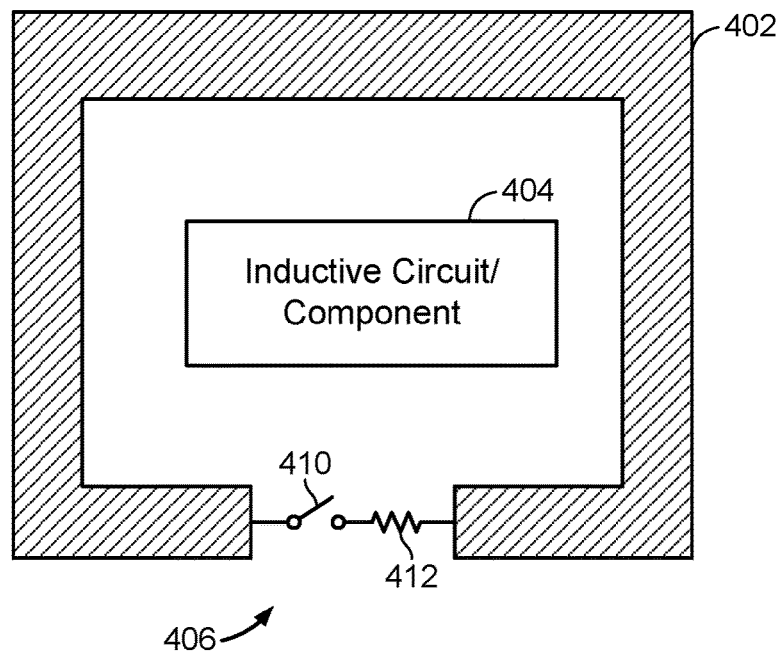
FIG. 4 is a diagram of a guard ring with a frequency tuning circuits.

FIG. 4 is a diagram of a guard ring with a frequency tuning circuit, or components. FIG. 4 shows a guard ring 402 that surrounds an inductor circuit or component 404. The guard ring 402 does not completely surround the inductor circuit or component 404, there being a gap 406 in the guard ring 402. Coupled across the gap 406, between the two ends of the guard ring 402, is a switch 410, such as a transistor, in series with a resistor 412, for example, a poly resistor or a metal resistor. When the switch 410 is Open one level of inductance of the inductor circuit or component inside the guard ring 402 is provided. When the switch 410 is Closed a different level of inductance of the inductor circuit or component inside the guard ring 402 is provided. In this way, the inductance of the inductor circuit or component 404 inside the guard ring 402 can be "tuned" at different frequencies.

Figure 5:
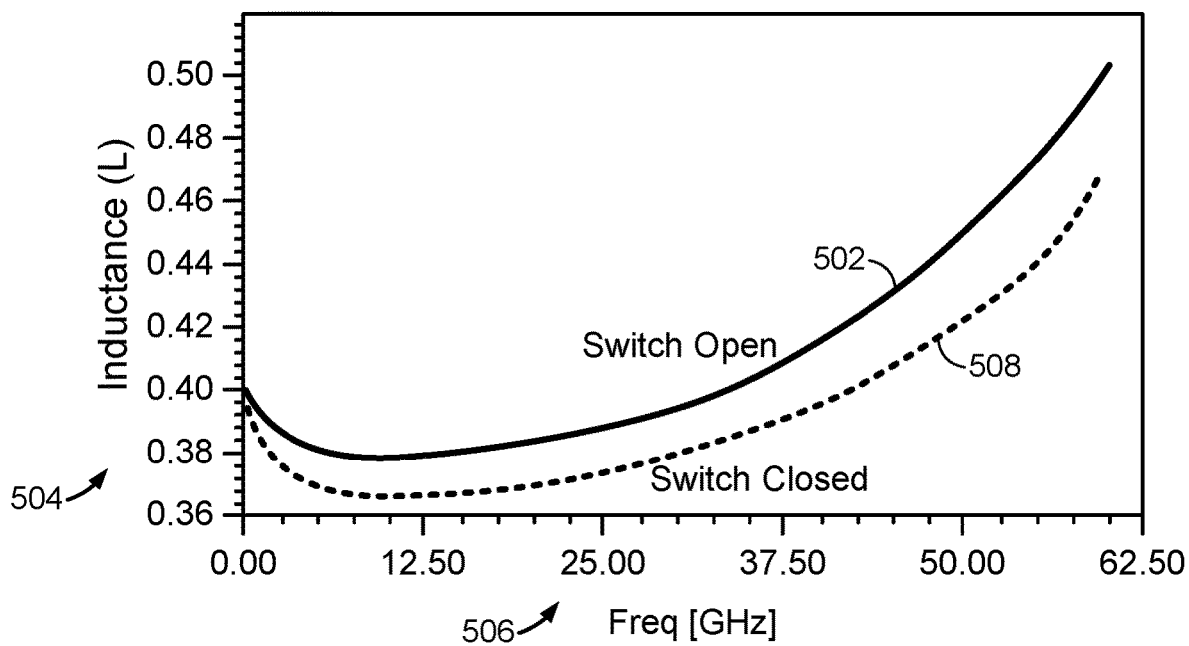
FIG. 5 is a diagram illustrating relative levels of inductance for an inductor circuit or component inside a guard ring with a tuning circuit couple across a gap of the guard ring.

FIG. 5 is a diagram illustrating relative levels of inductance for the inductor circuit or component 404 inside the guard ring 402 of FIG. 4 when the switch 410 is Open and Closed. FIG. 5 shows a first curve 502 of inductance 504 versus frequency 506 for the inductor circuit or component 404 inside the guard ring 402 with the switch 410 Open. FIG. 5 also shows a second curve 508 of inductance 504 versus frequency 506 with the switch 410 Closed.

As FIG. 5 shows, the inductance of the inductor circuit or component 404 inside the guard ring 402 of FIG. 4 at a particular frequency depends on whether the switch 410 is Open versus Closed. For example, at a frequency of about 10 GHz, the inductance of the inductor circuit or component 404 inside the guard ring 402 is about 0.37 nH with the switch 410 Open (curve 502) and about 0.38 nH with the switch 410 Closed (curve 508). At a frequency of about 50 GHz, the inductance with the switch 410 Open (curve 502) is about 0.45 nH and the inductance with the switch Closed (curve 508) is about 0.42 nH. As FIG. 5 illustrates, by Opening or Closing the switch 510 the inductance of the inductor circuit or component 404 inside the guard ring 402 can vary with frequency to provide a desired inductance value.

Figure 6C:
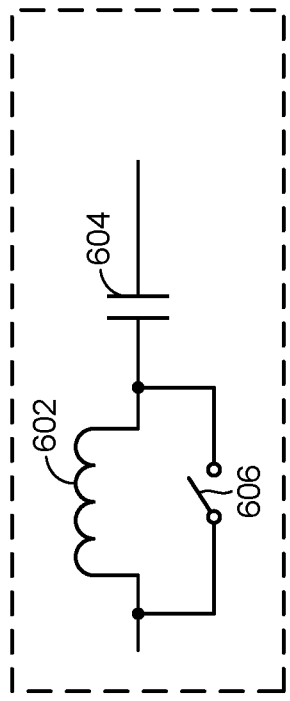
FIGS. 6A-6E show examples of series inductor/capacitor (LC) resonator components or circuits that can be coupled in a gap of a guard ring to get a desired level of isolation.
Figure 6E:
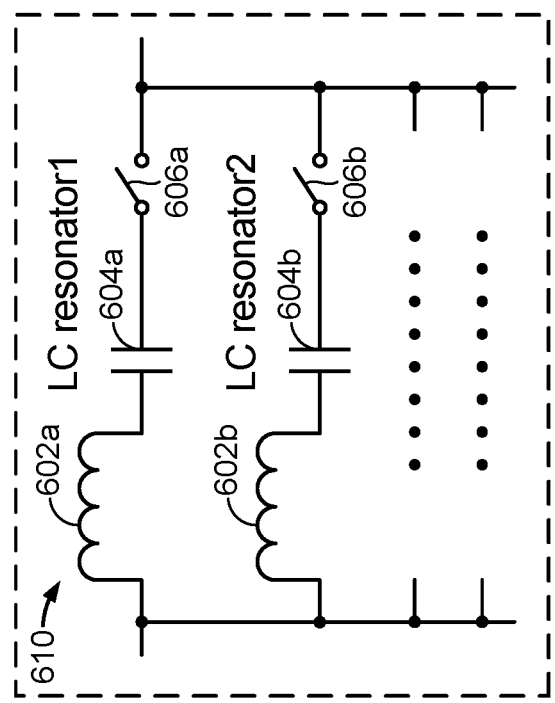
Figure 6A:
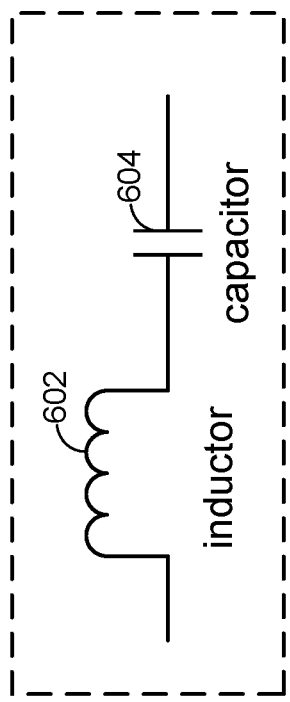
Figure 6B:
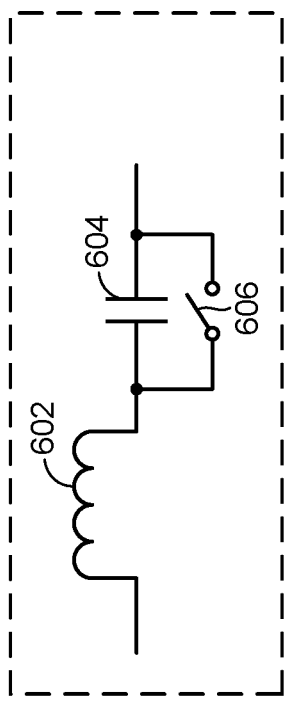
Figure 6D:
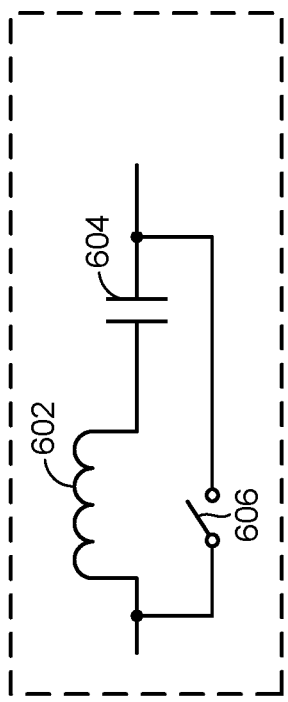

FIGS. 6A-6E show examples of series inductor/capacitor (LC) configured as resonator components or circuits that can be coupled across a gap of a guard ring to get a desired level of isolation. FIG. 6A shows an LC resonator that includes an inductor 602 coupled in series with a capacitor 604. The inductor can be, for example, a one turn inductor or a multi-turn inductor. The capacitor can be, for example, a metal-oxide-metal (MOM) capacitor, or a metal-insulator-metal (MIM) capacitor, or a metal-oxide-silicon (MOS) capacitor. FIG. 6B is similar to FIG. 6A with a switch 606 coupled in parallel to the capacitor 604. When the switch 606 is Open the resonator is the inductor 602 in series with the capacitor 604. When the Switch 604 is Closed, the capacitor 604 is effectively removed from the circuit and only the inductor 602 is coupled across the gap in the guard ring. FIG. 6C is similar to FIG. 6A with a switch 606 coupled in parallel to the inductor 602. When the switch 606 is Open the resonator is the inductor 602 in series with the capacitor 604. When the Switch 604 is Closed, the inductor 602 is effectively removed from the circuit and only the capacitor 604 is coupled across the gap in the guard ring. FIG. 6D has the switch 606 coupled in parallel with the series combination of the inductor 602 and capacitor 604. When the Switch 606 is Open the inductor 602 in series with the capacitor 604 is coupled across the gap in the guard ring. When the switch 606 is Closed the inductor 602 in series with the capacitor 604 are effectively removed from the gap and the two ends of the gap are coupled to each other through the switch 606.

FIG. 6E shows a bank of series inductor/capacitor (LC) resonators 610. Each of the LC resonators in the bank of resonators 610 include an inductor 602a-n in series with a capacitor 604a-n in series with a switch 606a-n. Operation of the switches 606a-n can be used to couple a particular LC resonator in the bank of resonators 610 across the gap of the guard ring. In addition, multiple switches 606a-n can be Closed so that multiple LC resonators in the bank of resonators 610 can be coupled in parallel across the gap of the guard ring. Selecting desired values for the inductors 602a-n and capacitors 604a-n can be used to achieve desired isolation level of the guard ring at desired frequency. The bank of series inductor/capacitor resonators 610 can be useful in devices that need to operate at different frequency bands, such as multi-band devices like cell phones, or other wireless communication device.

Figure 7:
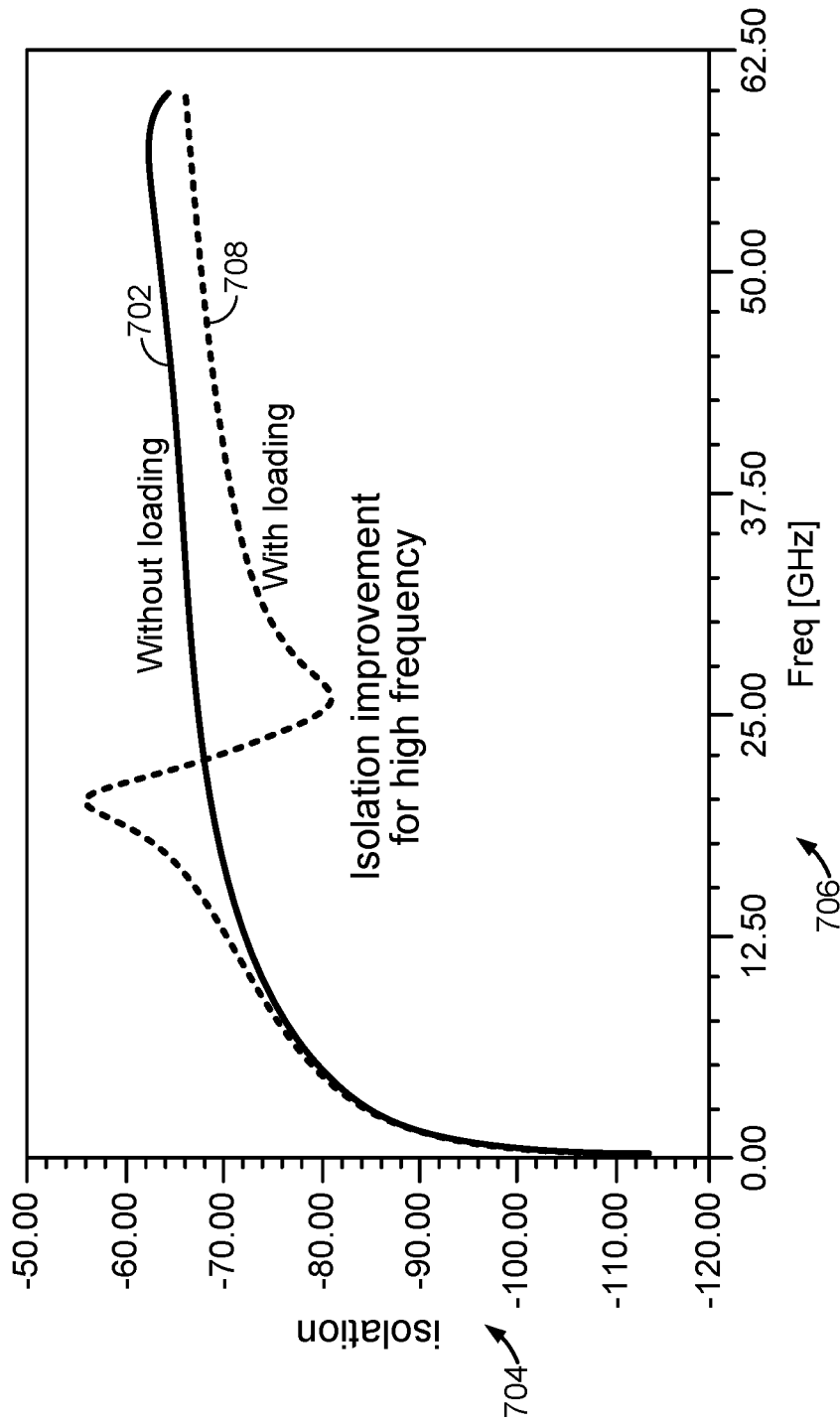
FIG. 7 is a diagram illustrating relative levels of isolation for a guard ring with series inductor/capacitor (LC) resonator tuning components coupled across a gap of the guard ring.

FIG. 7 is a diagram illustrating relative levels of isolation for the guard ring with the components of FIG. 6A coupled across the gap of the guard ring. FIG. 7 shows a first curve 702 of isolation 704 versus frequency 706 for the guard ring with no circuit or components coupled across the gap of the guard ring. FIG. 7 also shows a second curve 708 of isolation 704 versus frequency 706 for the guard ring with a series inductor capacitor (LC) resonator coupled across the gap of the guard ring.

As FIG. 7 shows, the isolation provided by the guard ring with no components coupled across the gap of the guard ring can vary versus a series LC resonator coupled across the gap. For example, at a frequency of about 10 GHz, the isolation provided by the guard ring without components coupled across the gap (curve 702) is about −72 dB and the isolation with the series LC resonator coupled across the gap (curve 708) is about −73 dB. At a frequency of about 20 GHz, the isolation provided by the guard ring without components coupled across the gap (curve 702) is about −70 dB and the isolation with the series LC resonator coupled across the gap (curve 708) is about −55 dB. At a frequency of about 26 GHz, the isolation provided by the guard ring with no components coupled across the gap (curve 702) is about −68 dB and the isolation with the series LC resonator coupled across the gap (curve 708) is about −82 dB. As FIG. 3 illustrates, by coupling a series LC resonator across the gap of a guard ring the isolation of the guard ring can vary with frequency to provide a desired isolation value.

Figure 8B:
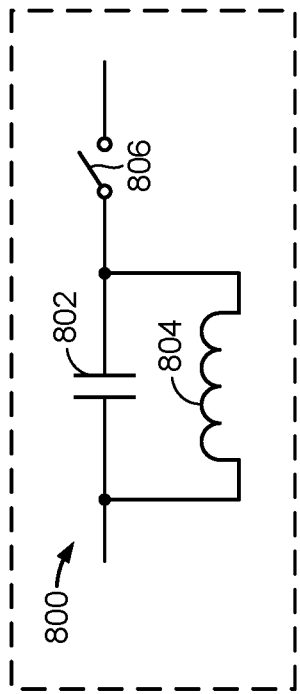
FIGS. 8A-8D show examples of parallel inductor/capacitor (LC) resonator components or circuits that can be coupled in the gap of a guard ring to get a desired level of isolation.
Figure 8D:
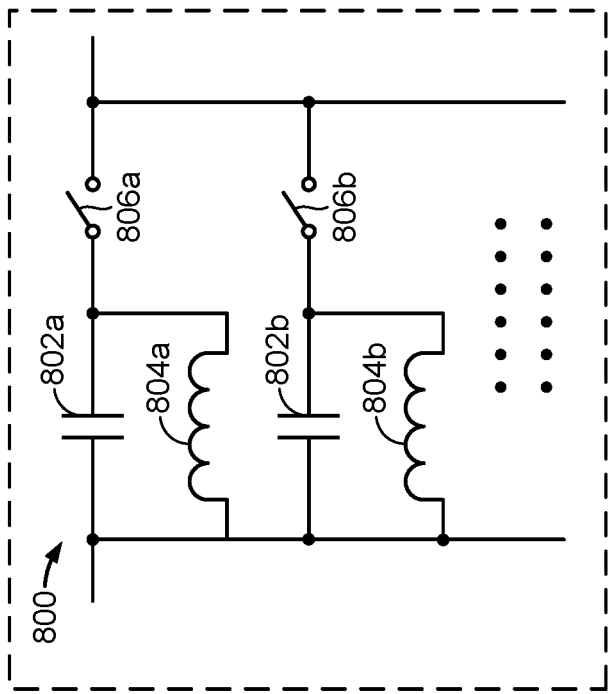
Figure 8A:
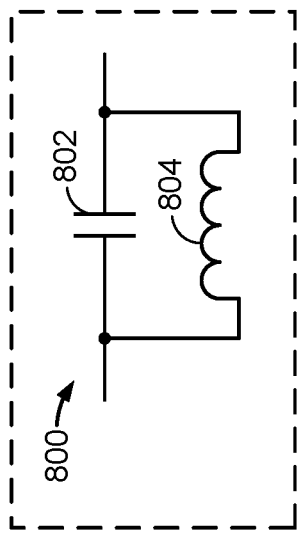
Figure 8C:
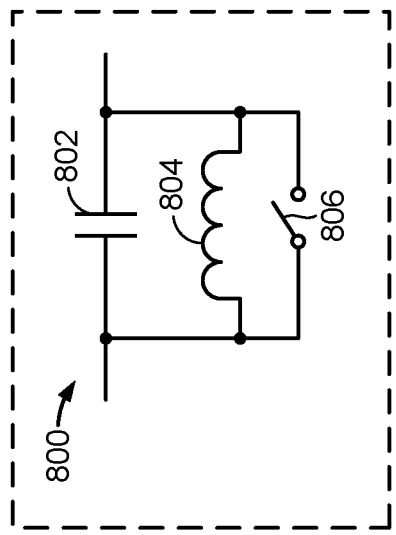

FIGS. 8A-8D show examples of parallel inductor/capacitor (LC) resonator components or circuits that can be coupled across the gap of a guard ring to get a desired level of isolation. FIG. 8A shows a parallel LC resonator 800 that includes a capacitor 802 coupled in parallel with an inductor 804 that can be coupled across the gap in a guard ring. FIG. 8B is similar to FIG. 8A with a switch 806 coupled in series to the parallel LC resonator 800. When the switch 806 is Open the parallel LC resonator 800 is effectively removed from the guard ring gap. When the switch 806 is Closed, the parallel LC resonator 800 is coupled across the gap of the guard ring. FIG. 8C is similar to FIG. 8A with a switch 806 coupled in parallel to the parallel LC resonator 800. When the switch 806 is Open the parallel LC resonator 800 is coupled across the gap of the guard ring. When the switch 806 is Closed, the parallel LC resonator 800 is effectively removed and the two ends of the guard ring are coupled directly together.

FIG. 8D shows a bank of parallel LC resonators 800a-n. Each of the parallel LC resonators 800 in the bank of resonators 800a-n include a capacitor 802a-n coupled in parallel with an inductor 804a-n. Coupled in series with each of the parallel LC resonators 800a-n is a switch 806a-n. Operation of the switches 806a-n can be used to couple a particular parallel LC resonator in the bank of resonators 800a-n across the gap of the guard ring. In addition, multiple switches 806a-n can be closed so that multiple parallel LC resonators 800a-n in the bank of resonators can be coupled in parallel across the gap of the guard ring. Selecting desired values for the capacitors 802a-n and inductors 804a-n can be used to achieve desired isolation level of the guard ring at desired frequency. The bank of parallel LC resonators 800a-n can be useful in devices that need to operate at different frequency bands, such as multi-band devices like cell phones, or other wireless communication device.

Figure 9:
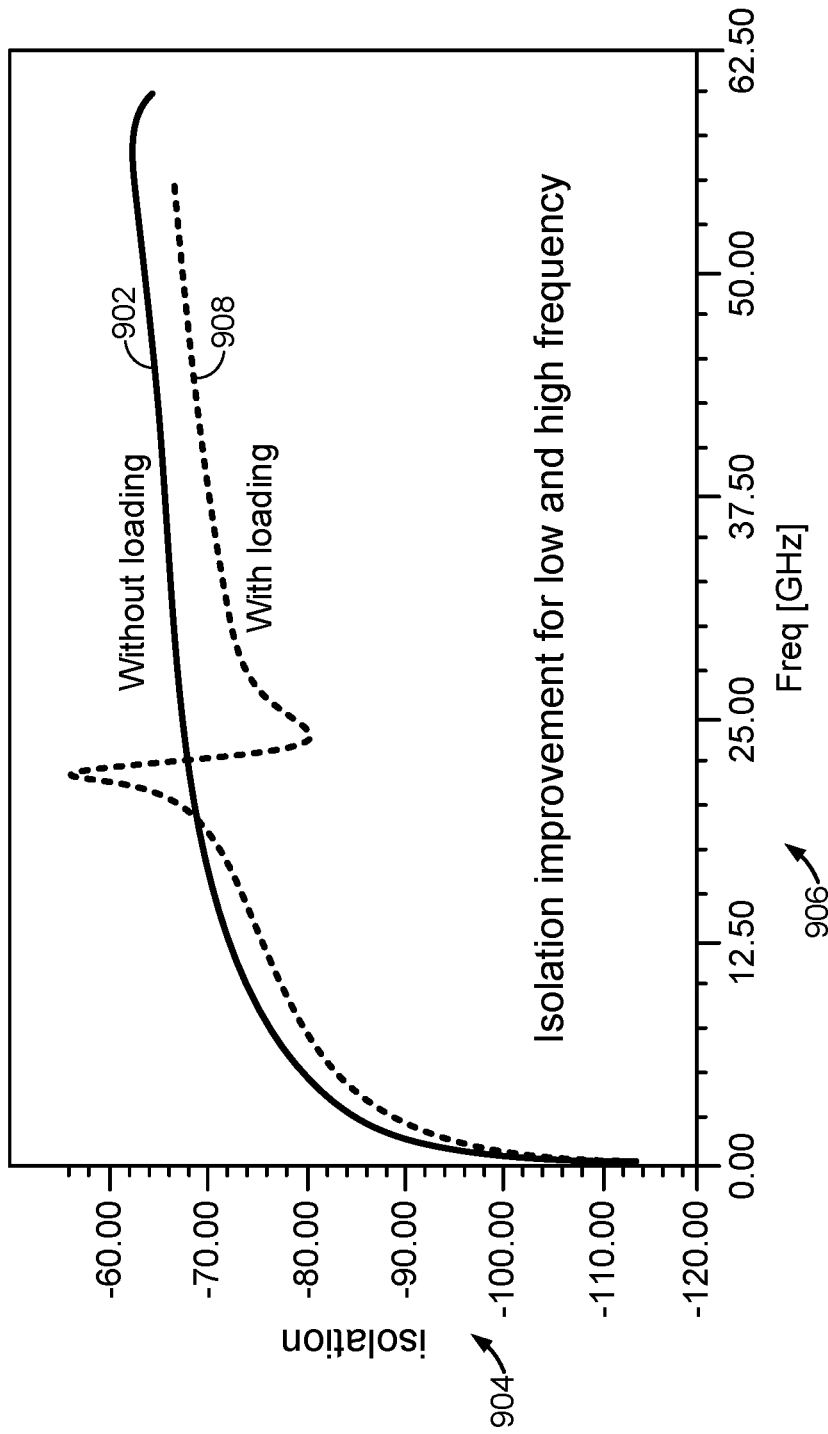
FIG. 9 is a diagram illustrating relative levels of isolation for a guard ring with parallel inductor/capacitor (LC) resonator tuning components coupled across a gap of the guard ring.

FIG. 9 is a diagram illustrating relative levels of isolation for the guard ring with the components of FIG. 8A coupled across the gap of the guard ring. FIG. 9 shows a first curve 902 of isolation 904 versus frequency 906 for the guard ring with no circuit or components coupled across the gap of the guard ring. FIG. 9 also shows a second curve 908 of isolation 904 versus frequency 906 for the guard ring with a parallel resonator coupled across the gap of the guard ring.

As FIG. 9 shows, the isolation provided by the guard ring with no components coupled across the gap of the guard ring can vary versus a parallel LC resonator coupled across the gap. For example, at a frequency of about 10 GHz, the isolation provided by the guard ring without components coupled across the gap (curve 902) is about −73 dB and the isolation with the parallel LC resonator coupled across the gap (curve 908) is about −77 dB. At a frequency of about 20 GHz, the isolation provided by the guard ring without components coupled across the gap (curve 902) is about the same value of −70 dB as the isolation with the parallel LC resonator coupled across the gap (curve 908). At a frequency of about 22 GHz, the isolation provided by the guard ring with no components coupled across the gap (curve 902) is about −69 dB and the isolation with the parallel LC resonator coupled across the gap (curve 908) is about −58 dB. At a frequency of about 24 GHz, the isolation provided by the guard ring with no components coupled across the gap (curve 902) is about −72 dB and the isolation with the parallel LC resonator coupled across the gap (curve 908) is about −82 dB. As FIG. 9 illustrates, by coupling a parallel LC resonator across the gap of a guard ring the isolation of the guard ring can vary with frequency to provide a desired isolation value.

Figure 10:
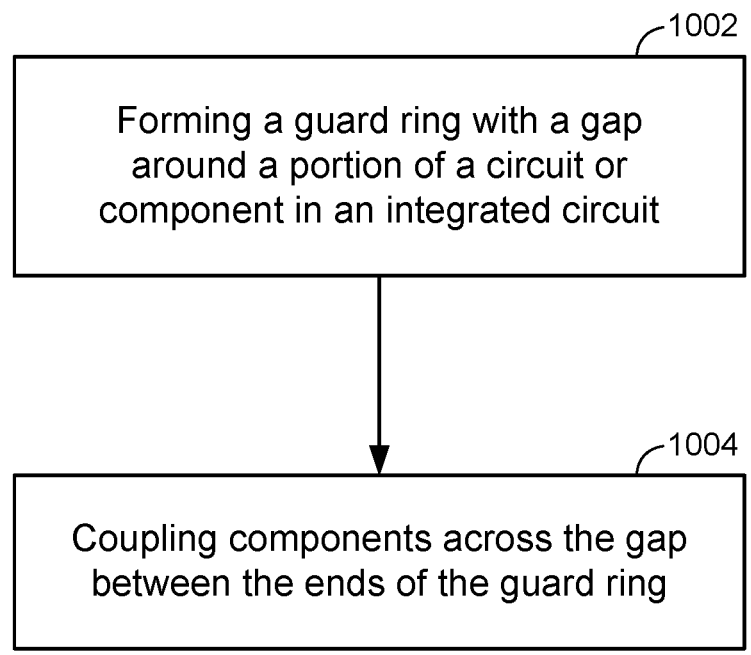
FIG. 10 is a flow diagram of using a guard ring with frequency tuning components.

FIG. 10 is a flow diagram of using a guard ring with frequency tuning components. Flow begins in block 1002 where a guard ring with a gap is formed around a circuit or component. Flow continues to block 1004 where components are coupled across the gap of the guard ring. In one embodiment, a switch, such as a transistor operated as a switch, is couple across the gap of the guard ring. Opening the switch will provide one level of isolation for the circuit or component and Closing the switch will provide a different level of isolation. In this way the isolation provided by the guard ring can be adjusted, or tuned, to different levels at a desired frequency. In another embodiment, the circuit or component can be an inductive circuit or an inductor, and a switch, such as a transistor, is in series with a resistor coupled across the gap. Operating the transistor so that the switch is Open will provide one level of inductance for the inductive circuit or inductor and when the switch is Closed a different level of inductance is provided. In this way the inductance provided by the inductive circuit or inductor can be adjusted, or tuned, to different levels at a desired frequency.

In other embodiments, other combinations of components, such as inductors, capacitors, and transistor switches, in various parallel and series configurations can be coupled across the gap of a guard ring to get a desired result, such as a desired isolation or inductance, as described above. Examples of some combinations of components are provided in FIGS. 6A-E and 8A-D, as well as other combinations of active of passive components.

The various illustrative logical blocks, modules, and circuits described in connection with the aspects disclosed herein may be implemented or performed in an integrated circuit (IC), a system on a chip (SoC), an Application Specific Integrated Circuit (ASIC), a Field Programmable Gate Array (FPGA) or other programmable logic device, discrete gate or transistor logic, discrete hardware components, or any combination thereof designed to perform the functions described herein.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in flow chart diagrams may be subject to numerous different modifications as will be readily apparent to one of skill in the art.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An integrated circuit comprising:
   a substrate;
   a plurality of metal layers;
   a plurality of dielectric layers between the plurality of metal layers and between the substrate and a first metal layer;
   a plurality of vias, at least one via coupling the substrate to the first metal layer, additional vias coupling adjacent metal layers;
   a guard ring comprising portions of at least two metal layers, the at least two metal layers coupled by at least one via, the guard ring surrounding a circuit, the guard ring having a gap, the guard ring coupled to the substrate of the integrated circuit by at least one via; and
   a tuning circuit coupled across the gap, the tuning circuit varies a level of isolation of the guard ring.

2. The integrated circuit of claim 1, wherein the tuning circuit comprises a transistor.

3. The integrated circuit of claim 1, wherein the tuning circuit comprises a resistor.

4. The integrated circuit of claim 3, wherein the resistor comprises a poly resistor or a metal resistor.

5. The integrated circuit of claim 1, wherein the tuning circuit comprises a capacitor.

6. The integrated circuit of claim 5, wherein the capacitor comprises a metal-oxide-metal (MOM) capacitor, a metal-insulator-metal (MIM) capacitor, or a metal-oxide-silicon (MOS) capacitor.

7. The integrated circuit of claim 1, wherein the tuning circuit comprises an inductor.

8. The integrated circuit of claim 7, wherein the inductor comprises a one turn inductor or a multi-turn inductor.

9. The integrated circuit of claim 1, wherein the tuning circuit comprises an active device.

10. The integrated circuit of claim 1, wherein the tuning circuit comprises a switch in series with a resistor.

11. The integrated circuit of claim 1, wherein the tuning circuit comprises a series inductor capacitor (LC) resonant circuit.

12. The integrated circuit of claim 1, wherein the tuning circuit comprises a parallel inductor capacitor (LC) resonant circuit.

13. The integrated circuit of claim 1, wherein the circuit comprises an inductor.

14. The integrated circuit of claim 1, wherein the circuit comprises a transformer.

15. The integrated circuit of claim 1, further comprising a second gap in the guard ring.

16. The integrated circuit of claim 15, further comprising a second tuning circuit coupled across the second gap.

17. A method of using a guard ring with a tuning circuit in an integrated circuit, the method comprising:
    forming a plurality of metal layers over a substrate;
    forming a plurality of dielectric layers between the plurality of metal layers and the substrate and a first metal layer;
    forming a plurality of vias, at least one via coupling the substrate to the first metal layer, additional vias coupling adjacent metal layers;
    forming a guard ring comprising portions of at least two metal layers, the at least two metal layers coupled by at least one via, the guard ring with a gap around a circuit fabricated in the integrated circuit, the guard ring coupled to the substrate of the integrated circuit by at least one via; and
    coupling a tuning component across the gap, the tuning component varies a level of isolation of the guard ring.

18. The method of claim 17, wherein the tuning component comprises a transistor, a resistor, an inductor, or a capacitor.

19. The method of claim 17, wherein the tuning component comprises an inductor capacitor (LC) resonator.

20. The method of claim 17, wherein the tuning component comprises an active device.

21. The method of claim 17, wherein the guard ring further includes a second gap and a second tuning component coupled across the second gap.

* * * * *